United States Patent
Umeyama

(10) Patent No.: US 11,895,776 B2
(45) Date of Patent: Feb. 6, 2024

(54) FLEXIBLE PRINTED WIRING BOARD, JOINED BODY, PRESSURE SENSOR AND MASS FLOW CONTROLLER

(71) Applicant: Proterial, Ltd., Tokyo (JP)

(72) Inventor: Takahiro Umeyama, Mie (JP)

(73) Assignee: HITACHI METALS, LTD., Tokyo (JP)

( * ) Notice: Subject to any disclaimer, the term of this patent is extended or adjusted under 35 U.S.C. 154(b) by 509 days.

(21) Appl. No.: 17/278,782

(22) PCT Filed: Sep. 20, 2019

(86) PCT No.: PCT/JP2019/036907
§ 371 (c)(1),
(2) Date: Mar. 23, 2021

(87) PCT Pub. No.: WO2020/066872
PCT Pub. Date: Apr. 2, 2020

(65) Prior Publication Data
US 2022/0039262 A1 Feb. 3, 2022

(30) Foreign Application Priority Data
Sep. 25, 2018 (JP) .................. 2018-178800

(51) Int. Cl.
*H05K 1/18* (2006.01)
*G01L 9/00* (2006.01)
(Continued)

(52) U.S. Cl.
CPC ............ *H05K 1/189* (2013.01); *G01L 9/0041* (2013.01); *G01L 9/04* (2013.01); *G01L 19/141* (2013.01);
(Continued)

(58) Field of Classification Search
CPC ........ H05K 1/189; H05K 1/115; H05K 1/181; H05K 3/323; H05K 2201/09372;
(Continued)

(56) References Cited

U.S. PATENT DOCUMENTS

2013/0141912 A1*  6/2013  Kim ...................... F21V 23/001
                                                        362/249.02
2020/0107447 A1*  4/2020  Sakamoto .............. H05K 3/425

FOREIGN PATENT DOCUMENTS

JP     H11-163055 A    6/1999
JP     2002-170910 A   6/2002
(Continued)

OTHER PUBLICATIONS

ISA, "International Search Report Regarding International Application No. PCT/JP2019/036907", dated Dec. 3, 2019, p. 5, Published in: JP.

*Primary Examiner* — Binh B Tran
(74) *Attorney, Agent, or Firm* — Neugeboren O'Dowd PC

(57) ABSTRACT

In a flexible printed wiring board (1), a first electrical conduction pattern (4) prepared on the first surface (3a) on which a bare chip (2) is mounted is prepared only inside a mounting region (3c) of the bare chip. Preferably, the first electrical conduction patterns (4) are prepared so as to avoid positions opposite to test electrodes (2b) which the bare chip comprises. Thereby, in the flexible printed wiring board used for mounting the bare chip, occurrence of malfunction resulting from electrical connection with a part other than a bump of the bare chip can be certainly prevented, and reliability of various devices using the bare chip can be improved.

26 Claims, 7 Drawing Sheets

(51) Int. Cl.
  *G01L 9/04*  (2006.01)
  *G01L 19/14*  (2006.01)
  *G05D 7/06*  (2006.01)
  *H05K 1/11*  (2006.01)
  *H05K 3/32*  (2006.01)

(52) U.S. Cl.
  CPC ............... *G05D 7/06* (2013.01); *H05K 1/115* (2013.01); *H05K 1/181* (2013.01); *H05K 3/323* (2013.01); *H05K 2201/09372* (2013.01); *H05K 2201/09836* (2013.01); *H05K 2201/10151* (2013.01)

(58) Field of Classification Search
  CPC .......... H05K 2201/09836; H05K 2201/10151; G01L 9/0041; G01L 9/04; G01L 19/141; G05D 7/06
  USPC .......................................................... 361/749
  See application file for complete search history.

(56) References Cited

FOREIGN PATENT DOCUMENTS

| | | | |
|---|---|---|---|
| JP | 2005340292 | A | 12/2005 |
| JP | 2011-029498 | A | 2/2011 |
| JP | 2013-077800 | A | 4/2013 |
| WO | 2007105763 | A1 | 9/2007 |
| WO | 2013160989 | A1 | 10/2013 |
| WO | 2016056555 | A1 | 4/2016 |

* cited by examiner

FLEXIBLE PRINTED WIRING BOARD, JOINED BODY, PRESSURE SENSOR AND MASS FLOW CONTROLLER

BACKGROUND

Field

The present invention relates to a flexible printed wiring board used for mounting a bare chip.

Background

A bare chip refers to a naked semiconductor chip which has just been cut by being diced from a wafer and has not been put into a package yet. When adopting a bare chip as a semiconductor chip, a printed wiring board on which a semiconductor chip is mounted can be miniaturized since a bare chip is not provided with a package and/or a lead frame, etc. In order to mount a bare chip on a printed wiring board, electrodes of the bare chip and electrical conduction patterns of the printed wiring board are electrically connected with each other through projections, which are referred to as "bumps", prepared on the electrode of the bare chip.

Printed wiring boards are roughly classified into a rigid printed board in a shape of a plate and a flexible printed wiring board in a shape of a film. For mounting a bare chip, a rigid printed board is usually used. However, for example, in a case where a bare chip needs to move in an apparatus with which a bare chip is mounted and a case where it is necessary to electrically connect (wire) an electrode of a bare chip with an electrical conduction pattern of a printed wiring board in a narrow space, etc., it is difficult to mount the bare chip using a rigid printed board. In such a case, a flexible printed wiring board which can be bent freely can be used in place of a rigid printed board.

For example, in a pressure sensor 8 which is described in International Patent Publication No. WO2016/056555 (PTL1) and is described again in FIG. 12 of the present application, a flexible printed wiring board 1 can be used as a wiring between an external electrode 6 and a bare chip 2 which functions as a strain sensor. One surface of the bare chip 2 is joined to a surface of an elastic body moved in conjunction with a diaphragm. On the other surface, an electrode is prepared and a bump 2a is formed on a surface of the electrode. For electrical bonding between the bump 2a of the bare chip 2 and the external electrode 6, it is desirable to adopt a means by which the electrical bonding is maintained even when the bare chip 2 moves and wiring can be easily attained even in a narrow airtight space. The flexible printed wiring board 1 is suitable for such an intended use.

SUMMARY

An aspect may be characterized as a flexible printed wiring board having an insulation substrate comprising a first surface that is a surface on which a bare chip is mounted and a second surface that is a surface located on the opposite side of said first surface. The flexible printed wiring board also includes one or more first electrical conduction patterns which are prepared on said first surface and include first electrode parts arranged at positions where the first electrode part can be electrically connected with a bump of said bare chip in a mounted state that is a state where said bare chip is mounted on said first surface. One or more through holes are drilled in said insulation substrate, and one or more second electrical conduction patterns prepared on said second surface. At least a part of said first electrical conduction patterns further comprise a first electrical conduction part that is a part for electrically connecting said first electrode part with said through hole, and at least a part of said first electrical conduction patterns and at least a part of said second electrical conduction patterns are electrically connected with each other through said through holes. In addition, said first electrical conduction patterns are prepared only inside a mounting region that is a region opposite to said bare chip in said mounted state Another aspect may be characterized as a joined body comprising the flexible printed wiring board and a bare chip.

Yet another aspect may be characterized as a pressure sensor having the joined body and the bare chip is a strain sensor.

Another aspect may be characterized as a mass flow controller, which has the pressure sensor according and is configured to monitor pressure of fluid by the pressure sensor.

DETAILED DESCRIPTION

Figure 1:
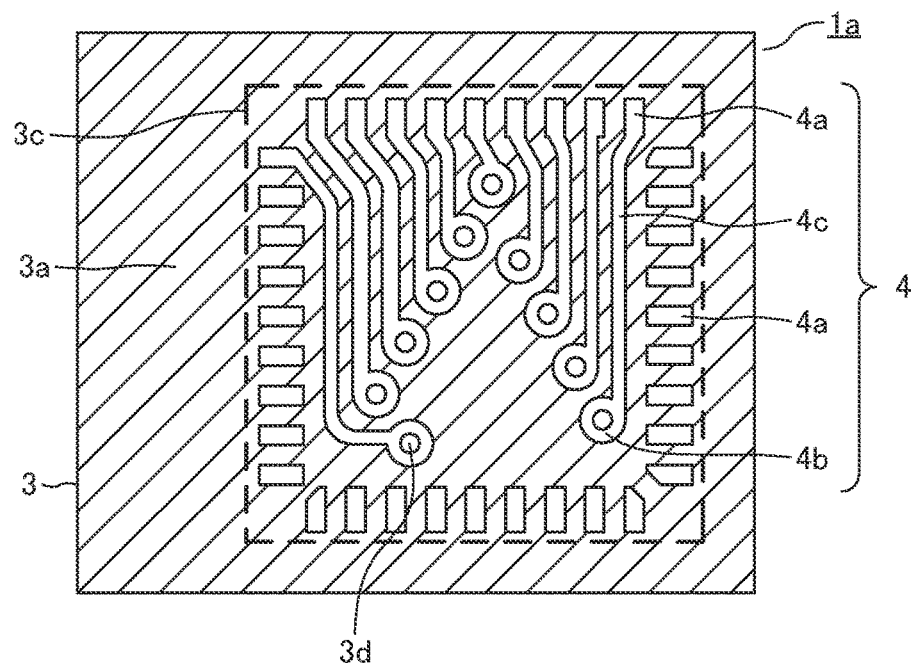
FIG. 1 is a partial schematic view for showing an example of first electrical conduction patterns of a flexible printed wiring board according to a first embodiment of the present invention (first wiring board).

Embodiments of the present invention will be explained in detail below, referring to accompanying drawings. The following explanation and drawings just exemplify embodiments of the present invention, and embodiments of the present invention are not limited to the embodiments shown in the following explanation and drawings.

Technical Problem

Since a bare chip is not put in a package, as compared with a semiconductor chip packed up in a package, sufficient consideration on undesirable electrical contacts is needed when mounting. For example, as described in International Patent Publication No. WO2007/105763 (PTL2), a cut surface made by dicing is exposed on a side face (lateral surface) of a bare chip, and no insulation coating is usually formed on the surface. When a flexible printed wiring board is disposed in a narrow space in its bent state, there is a possibility that an electrical conduction pattern on a surface of a flexible printed wiring board may contact with an edge of a bare chip. As a result, an electrical current may flow between them and the bare chip may cause unexpected malfunction.

Moreover, some semiconductors are provided with test electrodes for performing validation (operation verification) in the state of a wafer in the middle of its manufacturing process, as described in the Patent Document 3 Japanese Patent Application Laid-Open (kokai) No. 2013-77800 (PTL3), for example. The test electrodes are usually prepared near a border of a semiconductor chip, and the test electrodes are distributed at an edge of a surface of a bare chip when a wafer is cut and processed into the bare chip. As a result, there is a possibility that an electrical conduction pattern prepared on a surface of a flexible printed wiring board and the test electrode of the bare chip may be electrically connected with each other to cause malfunction of the bare chip when the flexible printed wiring board is bent.

It is possible to prepare an insulation coating (resist) on a part of a surface of an electrical conduction pattern of a flexible printed wiring board for the purpose of preventing undesirable electrical connection as mentioned above, for example. However, there is a possibility that the insulation coating may be damaged by contact with an edge of a bare chip and its insulation function may be lost in a mounting process and/or subsequent use, etc. Moreover, when bumps of the bare chip and the test electrodes are prepared close to each other, it is technically difficult to dispose an insulation coating with high precision such that the insulation coating does not exist at positions opposite to the bumps and the insulation coating exists only at positions opposite to the test electrodes.

The present invention has been conceived in view of subjects as mentioned above, and one of the objectives thereof is to provide a flexible printed wiring board which can surely prevent electrical connection with a part other than a bump of a bare chip in a flexible printed wiring board used for mounting of the bare chip.

Solution to Problem

A flexible printed wiring board with according to the present invention (which may be referred to as a "present invention wiring board" hereafter) is a flexible printed wiring board having an insulation substrate and one or more first electrical conduction patterns. The insulation substrate comprises a first surface that is a surface on which a bare chip is mounted and a second surface that is a surface located on the opposite side of the first surface. The first electrical conduction patterns are prepared on the first surface and include first electrode parts arranged at positions where the first electrode part can be electrically connected with a bump of the bare chip in a mounted state that is a state where the bare chip is mounted on the first surface. Furthermore, the first electrical conduction pattern is prepared only inside a mounting region that is a region opposite to the bare chip in the above-mentioned mounted state.

In the present invention wiring board, no electrical conduction pattern is prepared outside the mounting region of the bare chip, on the first surface on which the bare chip is mounted. For this reason, even in a case where the flexible printed wiring board is bent in a mounting process and/or subsequent use, etc., a possibility that the electrical conduction pattern of the flexible printed wiring board may contact with an edge of the bare chip can be significantly reduced.

Moreover, a joined body according to the present invention (which may be referred to as a "present invention joined body" hereafter) is a joined body comprising the present invention wiring board and a bare chip. Furthermore, a pressure sensor according to the present invention (which may be referred to as a "present invention sensor" hereafter) is a pressure sensor having the present invention joined body wherein the bare chip is a strain sensor. In addition, a mass flow controller according to the present invention (which may be referred to as a "present invention apparatus" hereafter) is a mass flow controller which has the present invention pressure sensor and is configured so as to monitor pressure of fluid by the present invention pressure sensor.

Advantageous Effects

By mounting a bare chip using the present invention wiring board, malfunction of the bare chip resulting from unexpected electrical connection can be prevented surely, and reliability of various devices using the bare chip can be improved.

First Embodiment

A flexible printed wiring board according to a first embodiment of the present invention (which may be referred to as a "first wiring board" hereafter) is a flexible printed wiring board having an insulation substrate 3 and one or more first electrical conduction patterns 4. The insulation substrate 3 comprises a first surface 3a that is a surface on which a bare chip 2 is mounted and a second surface 3b that is a surface located on the opposite side of the first surface 3a. The first electrical conduction patterns 4 are prepared on the first surface 3a and include a first electrode parts 4a arranged at positions where the first electrode part 4a can be electrically connected with a bump 2a of the bare chip 2 in a mounted state that is a state where the bare chip 2 is mounted on the first surface 3a. Furthermore, the first electrical conduction patterns 4 are prepared only inside a mounting region 3c that is a region opposite to the bare chip 2 in the above-mentioned mounted state.

FIG. 1 is a partial schematic view for showing an example of the first electrical conduction patterns 4 of a first wiring board 1a. In FIG. 1, a shaded part represents the insulation substrate 3, and an outlined parts represent areas on which the first electrical conduction patterns 4 are formed. In FIG.

1, a part of the first wiring board 1a, on which the first electrical conduction patterns 4 are formed, is enlarged to be shown.

The insulation substrate 3 is a thin film constituted by a flexible insulating material. As the material which constitutes the insulation substrate 3, polyester or polyimide can be used, for example. Since polyester is a thermoplastic material, it is desirable to form wiring using conductive paste, etc. at normal temperature when polyester is adopted as the material which constitutes the insulation substrate 3. On the other hand, since polyimide has heat resistance, wiring can be formed by pressure joining while heating when polyimide is adopted as the material which constitutes the insulation substrate 3. It is preferable that the thickness of the insulation substrate 3 is 10 micrometers or more and 80 micrometers or less, since sufficient strength is obtained when the thickness is 10 micrometers or more and excellent flexibility is attained when the thickness is 80 micrometer or less. More preferably, the thickness of the insulation substrate 3 is 20 micrometers or more and 40 micrometers or less.

The insulation substrate 3 comprises a first surface 3a that is a surface on which a bare chip 2 is mounted and a second surface 3b that is a surface located on the opposite side of the first surface 3a. Since the first wiring board 1a is used for mounting the bare chip 2 on its surface, the first surface 3a and the second surface 3b are distinguished based on which is the surface on which the bare chip 2 is mounted in the insulation substrate 3. The first surface 3a and the second surface 3b correspond to the front and back of the identical insulation substrate 3, and their areas and shapes are same. In the first writing board 1a, the first surface 3a and the second surface 3b of the insulation substrate 3 need to have areas at least equal to or larger than the area corresponding to the mounting region 3c of the bare chip 2, which will be described later. Shape of the first writing board 1a is not limited in particular.

In the first wiring board 1a, the number of the bare chips 2 mounted on the first surface 3a of the insulation substrate 3 may be one, or two or more. When the number of the bare chip 2 is one, the first wiring board 1a performs a function as a wiring which electrically connects the bare chip 2 with an external electrode, etc. When the number of the bare chips 2 is two or more, the first wiring board 1a can also performs a function as a wiring for electrical connections between electrodes of a plurality of the bare chips 2, in addition to the above-mentioned function.

The first electrical conduction patterns 4 are prepared on the first surface 3a of the insulation substrate 3 and comprise a first electrode parts 4a arranged at positions where the first electrode part 4a can be electrically connected with a bump 2a of the bare chip 2 in a mounted state that is a state where the bare chip 2 is mounted on the first surface. The first electrical conduction patterns 4 are constituted by foil having excellent flexibility and electrical conductivity. As a material which constitutes the first electrical conduction patterns 4, copper, silver, gold or aluminum can be used, for example. Among these materials, copper is preferable because it is relatively inexpensive and easy to be processed by plating, etching, etc. As a manufacturing process of such foil, a rolling process and an electrolytic process can be mentioned, for example. In the first wiring board 1a, it is preferable to use rolled copper foil which is rich in malleability, for example.

It is preferable that the thickness of the first electrical conduction pattern 4 is 5 micrometers or more and 20 micrometers or less, since sufficient conductivity and strength are obtained when the thickness is 5 micrometers or more and excellent flexibility is attained when the thickness is 20 micrometer or less. More preferably, the thickness of the first electrical conduction pattern 4 is 7 micrometers or more and 12 micrometers or less. The first electrical conduction pattern 4 can be formed by well-known processes in a manufacturing process of a flexible printed wiring board, namely processes such as formation of a photosensitive resist layer, exposure, etching and removal of the photosensitive resist layer.

Figure 2:
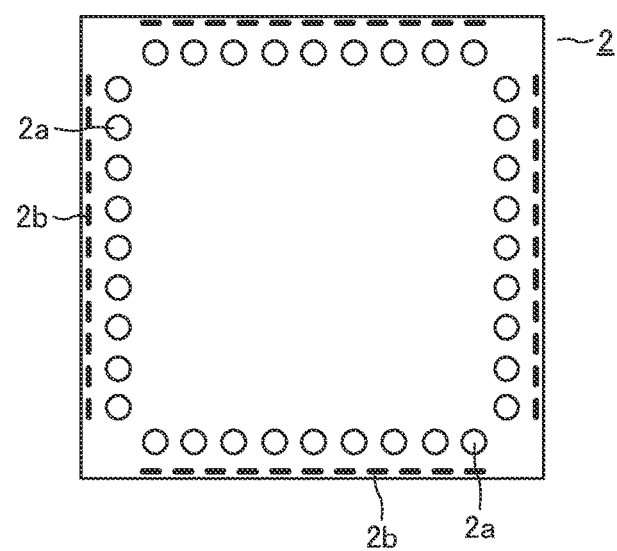
FIG. 2 is an entire schematic view for showing an example of a bare chip mounted on the first wiring board.

FIG. 2 is an entire schematic view for showing an example of the bare chip 2 mounted on the first wiring board 1a. The bare chip 2 exemplified in FIG. 2 is a tabular chip which was cut out from a wafer by dicing and has a square shape. As mentioned above, a cut surface of the bare chip 2 cut by dicing is exposed, and no insulation coating is usually formed on the surface. Electrodes which are not shown are exposed on the surface of the bare chip 2 shown in FIG. 2, and bumps 2a are formed on a surface of each of the electrodes so as to project from the surface. In FIG. 2, shapes and arrangement positions of the bumps 2a are exemplified. In the example shown in FIG. 2, nine pieces of the bumps 2a are disposed along each side (edge) of the bare chip 2, thirty-six pieces of the bumps 2a in total.

The first electrical conduction patterns 4 exemplified in FIG. 1 comprise nine pieces of the first electrode parts 4a along each side of the mounting region 3c of the bare chip 2, thirty-six pieces of the first electrode parts 4a in total. These first electrode parts 4a are arranged at positions where the first electrode part 4a can be electrically connected with the bump 2a of the bare chip 2. More specifically, the first electrode parts 4a are prepared at positions opposite to the bumps 2a of the bare chip 2 shown in FIG. 2, namely positions where a distance to the bump 2a is the shortest when the bare chip 2 is mounted on the first surface 3a of the insulation substrate 3. As for ten pieces of the thirty-six pieces of the first electrode parts 4a, long and narrow electrical conduction patterns 4c respectively extending from the positions of the first electrode parts 4a toward a center of the mounting region 3c are formed. Namely, these ten pieces of the first electrical conduction patterns 4 are constituted by these long and narrow electrical conduction patterns 4c and first electrode parts 4a. The remaining twenty-six pieces of the first electrical conduction patterns 4 are constituted only by the first electrode part 4a, respectively. Parts to which reference signs "3d" are assigned in FIG. 1 will be mentioned later in explanations about other embodiments of the present invention.

In the first electrical conduction patterns 4 exemplified in FIG. 1, among the thirty-six pieces of the first electrode parts 4a, only the ten pieces of the first electrode parts 4a connected to the above-mentioned long and narrow electrical conduction patterns 4c can exchange electrical signals with the bumps 2a of the bare chip 2. The remaining twenty-six pieces of the first electrode parts 4a are just electrically connected with the bumps 2a of the bare chip 2, and do not have intrinsic functions as electrodes. However, the flexible printed wiring board 1a and the bare chip 2 can be joined with good balance by forming the first electrode parts 4a at all the positions opposite to the bumps 2a of the bare chip 2.

In the first electrical conduction patterns 4 exemplified in FIG. 1, the first electrode parts 4a electrically connected with the bumps 2a of the bare chip 2 are formed along each side of the mounting region 3c of the bare chip 2. However, positions where the first electrode parts 4a are formed are not limited to the positions exemplified in FIG. 1. For example, when the bumps 2a of the bare chip 2 are formed in a central part of the mounting region 3c, the first electrode parts 4a can be also formed in a central part opposite to those bumps 2a. In this case, the above-mentioned long and narrow electrical conduction patterns 4c may be formed so as to extend toward the outside from the central part.

In the first wiring board 1a, the first electrical conduction patterns 4 are prepared only inside the mounting region 3c of the bare chip 2. The mounting region 3c of the bare chip 2 means a region on the first surface 3a of the insulation substrate 3 where the bare chip 2 is expected to be mounted in the flexible printed wiring board 1a. Namely, the mounting region 3c is a region opposite to the bare chip 2 in the above-mentioned mounted state. More precisely, the mounting region 3c is a region defined by a shade appears on the first surface 3a when a parallel beam of light is irradiated from the side of the bare chip 2 in a direction perpendicular to the first surface 3a in a state where the bare chip 2 is placed at a position where the bare chip 2 is expected to be mounted on the first surface 3a (namely, the mounting state). In FIG. 1, a shape of an outer circumference of the mounting region 3c, which corresponds to an outline of the bare chip 2, is expressed by a broken line. The first electrical conduction patterns 4 are formed only inside the mounting region 3c exemplified in FIG. 1, namely, only inside the region surrounded by the broken line. In the other words, the first electrical conduction patterns 4 are not formed outside the mounting region 3c on the first surface 3a.

Figure 3:
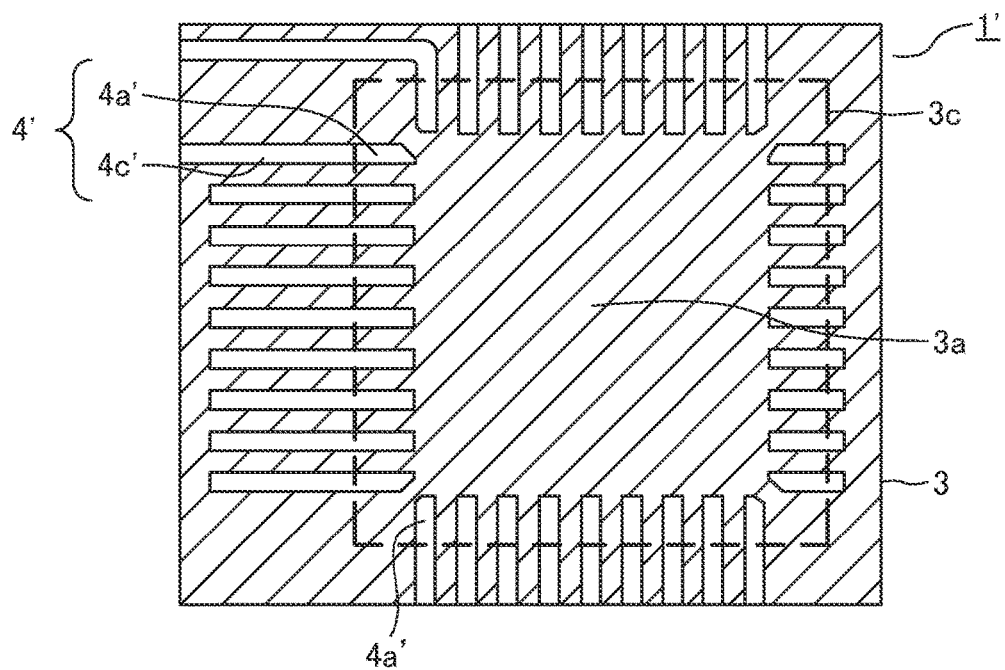
FIG. 3 is a partial schematic view for showing an example of first electrical conduction patterns of a flexible printed wiring board according to a conventional technology (conventional wiring board).

FIG. 3 is a partial schematic view for showing an example of first electrical conduction patterns of a flexible printed wiring board according to a conventional technology (which may be referred to as a "conventional wiring board" hereafter). Positions of bumps 2a of a bare chip 2 mounted on the conventional wiring board 1' shown in FIG. 3 are the same as the positions of the bumps 2a of the bare chip 2 mounted on the first wiring board 1a shown in FIG. 2. For this reason, also in the conventional wiring board 1', thirty-six pieces of the first electrode parts 4a' in total are prepared along respective sides of the mounting region 3c, similarly to the case of FIG. 1. On the other hand, in the first electrical conduction patterns 4' of the conventional wiring board 1', unlike the case of the first wiring board 1a shown in FIG. 1, long and narrow electrical conduction patterns 4c' are prepared so as to protrude to the outside of the mounting region 3c of the bare chip 2.

In a state where the bare chip 2 is mounted on the conventional wiring board 1' shown in FIG. 3 (mounted state), in the interior of the mounting region 3c, the bumps 2a of the bare chip 2 and the first electrode parts 4a' of the first electrical conduction patterns 4' are joined and fixed with each other for electrical connection. For this reason, in the interior of the mounting region 3c, it is difficult for the conventional wiring board 1' to bend. However, in the external of the mounting region 3c, it is easy for the conventional wiring board 1' to bend since the conventional wiring board 1' is not fixed as densely as in the interior of the mounting region 3c. This situation is completely the same as in the case of the first wiring board 1a shown in FIG. 1.

As a result, in the conventional wiring board 1' shown in FIG. 3, when the conventional wiring board 1' is bent in the outside of the mounting region 3c, there is a possibility that a part which protrudes to the outside of the mounting region 3c of the first electrical conduction patterns 4' may contact with an edge of the bare chip 2 to cause malfunction of the bare chip 2. On the contrary to this, in the first wiring board 1a shown in FIG. 1, the first electrical conduction patterns 4 are formed only inside the mounting region 3c. Therefore, even when the first wiring board 1a is bent in the outside of the mounting region 3c, there is no possibility that the first electrical conduction patterns 4 may contact with an edge of the bare chip 2. For this reason, in accordance with the first wiring board 1a, malfunction of the bare chip 2 due to unexpected electrical connection can be prevented certainly.

Second Embodiment

A flexible printed wiring board according to the second embodiment of the present invention (which may be referred to as a "second wiring board" hereafter) is the above-mentioned first wiring board, wherein the bare chip 2 comprises test electrodes 2b. Furthermore, in the second wiring board, the first electrical conduction patterns 4 are prepared so as to avoid positions opposite to the test electrodes 2b.

The test electrodes 2b are electrodes prepared for the purpose of performing validation in a state of a wafer in the middle of a manufacturing process, etc., for example. By bringing a probe into contact with the test electrodes 2b, the electrical characteristics of an element built into the wafer, etc. can be measured, and a defective product can be sorted out. The test electrodes 2b are usually formed in a part at which the wafer is cut by dicing. This is because the test electrodes 2b need to have a certain size to allow the probe to contact with the test electrodes 2b and therefore an integration degree of an integrated circuit is reduced when the test electrodes 2b are prepared in a part where an element of the circuit is formed. Therefore, in the bare chip 2 obtained by dicing a wafer, the test electrodes 2b are usually located in a part close to an edge of a surface of the bare chip 2. Referring again to FIG. 2, in the bare chip 2 exemplified in FIG. 2, the test electrodes 2b are arranged at positions close to edges of the bare chip 2 in a region between the edges and the bumps 2a.

When the first electrical conduction patterns 4 are prepared at positions opposite to the test electrodes 2b in a case where the bare chip 2 comprises the test electrodes 2b, there is a possibility that a part of the first electrical conduction patterns 4, which is prepared at a position opposite to the test electrode 2b, may come into contact with the test electrode 2b to cause malfunction of the bare chip 2 when the flexible printed wiring board 1a is bent in the outside of the mounting region 3c. For the purpose of preventing such an electrical contact, it is possible to prepare an insulation coating (resist) on a part of the first electrical conduction patterns 4. However, when the bumps 2a and the test electrodes 2b are formed at positions close to each other like the bare chip 2 exemplified in FIG. 2, it is technically difficult to accurately prepare an insulation coating such that the insulation coating does not exist at positions opposite to the bumps 2a and exists only at positions opposite to the test electrodes 2b.

On the contrary to this, in the second wiring board, the first electrical conduction patterns 4 are prepared so as to avoid positions opposite to the test electrodes 2b. As a result, even when the second wiring board is bent in the outside of the mounting region 3c, there is no possibility that the first electrical conduction pattern 4 may contact with the test electrode 2b. Therefore, in accordance with the second wiring board, malfunction of the bare chip 2 due to unexpected electrical connection can be prevented more certainly. The first electrical conduction patterns 4 exemplified in FIG. 1 are prepared at positions slightly apart from the edges so as to avoid positions opposite to the test electrodes 2b shown in FIG. 2. Namely, the first wiring board 1a exemplified in FIG. 1 is a flexible printed wiring board which also has feature of the second wiring board as mentioned above. When the test electrodes 2b are prepared in a region other than a region close to the edge of the bare chip 2 unlike the case shown in FIG. 1 and FIG. 2, the first electrical conduction patterns 4 only have to be prepared so as to avoid positions opposite to the region where the test electrodes 2b are prepared.

Third Embodiment

A flexible printed wiring board according to a third embodiment of the present invention (which may be referred to as a "third wiring board" hereafter) is the above-mentioned first wiring board or second wiring board, which has one or more through holes 3d drilled in said insulation substrate 3 and one or more second electrical conduction patterns 5 prepared on the second surface 3b. Furthermore, in the third wiring board, the first electrical conduction patterns 4 and the second electrical conduction patterns 5 are electrically connected with each other through the through holes 3d.

Figure 4:
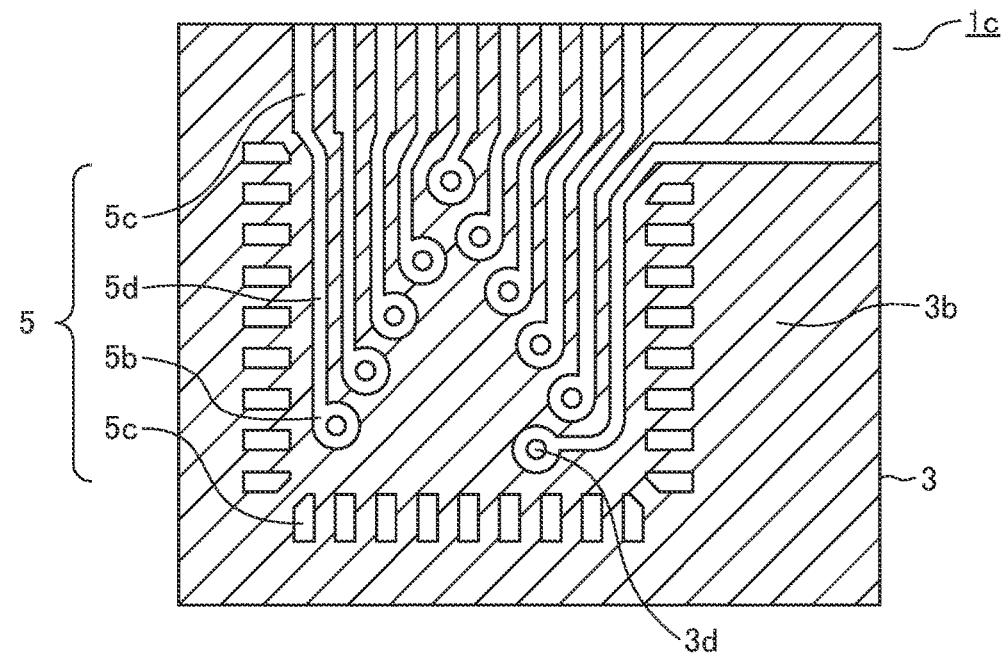
FIG. 4 is a partial schematic view for showing an example of second electrical conduction patterns of a flexible printed wiring board according to a third embodiment of the present invention (third wiring board).

FIG. 4 is a partial schematic view for showing an example of the second electrical conduction patterns 5 of the third wiring board 1c. In FIG. 4, a shaded part represents the insulation substrate 3, and an outlined parts represent areas on which the second electrical conduction patterns 5 are formed.

FIG. 4 is a drawing of the same area as the first electrical conduction patterns 4 shown in FIG. 1 when the area is observed from a backside of the insulating substrate 3 (opposite side to the first surface 3a), namely, from a side of the second surface 3b.

The through holes 3d are one or more through holes drilled in the insulation substrate 3. The through holes 3d are formed in a region where the first electrical conduction patterns 4 shown in FIG. 1 and the second electrical conduction patterns 5 shown in FIG. 4 overlap with each other. Since the first electrical conduction patterns 4 are formed only in the inside of the mounting region 3c, the positions where the through holes 3d are formed are also is the inside of the mounting region 3c, inevitably. The through holes 3d shown in FIG. 1 and FIG. 4 are prepared at ten positions corresponding to ends of the ten pieces of the long and narrow electrical conduction patterns 4c, which are shown in FIG. 1, on the side where the first electrode parts 4a are not prepared.

As a method of forming the through hole 3d, a well-known method can be employed. For example, after forming the first electrical conduction patterns 4 and the second electrical conduction patterns 5, the through holes 3d can be formed by a means such as a drill. It is preferable that joint (bonding) of the insulation substrate 3 with the first electrical conduction patterns 4 and the second electrical conduction patterns 5 is maintained at positions of the formed through holes 3d.

The second electrical conduction patterns 5 are formed on the second surface 3b of the insulation substrate 3. Since the third wiring board 1c comprises the second electrical conduction patterns 5, it is a double-sided flexible printed wiring board which has electrical conduction patterns on both sides of the insulation substrate 3. Since a material which constitutes the second electrical conduction patterns 5, preferable thickness, and a process for forming the patterns are the same as those for the first electrical conduction patterns 4, explanations thereof will be omitted here.

A part of the second electrical conduction patterns 5 exemplified in FIG. 4 include the ten pieces of the long and narrow electrical conduction patterns 5d respectively extending from positions of the ten through holes 3d toward the outside of the mounting region 3c, which is not shown. Unlike the first electrical conduction patterns 4, the second electrical conduction patterns 5 do not have to be prepared only in the inside of the mounting area 3c, and can be prepared so as to protruded to the outside of the mounting region 3c. The second surface 3b, on which the second electrical conduction patterns 5 are formed, is located on the opposite side to the first surface 3a, on which the bare chip 2 is mounted. For this reason, even in a case where the second electrical conduction patterns 5 are prepared so as to protrude to the outside of the mounting region 3c, there is no possibility that the second electrical conduction patterns 5 may contact with the edge of the bare chip 2 when the third wiring board 1c is bent.

Twenty-six pieces of the dummy electrodes 5c are formed at positions where the long and narrow electrical conduction patterns 5d are not formed among positions corresponding to backsides of the first electrode parts 4a. Since the dummy electrodes 5c are insulated from the first electrical conduction patterns 4 by the insulation substrate 3, the dummy electrodes 5c do not have a function as electrodes. The dummy electrodes 5c are formed for the purpose of making joint of the flexible printed wiring board 1 and the bare chip 2 more secure. More information on the dummy electrodes 5c will be mentioned later. Moreover, parts corresponding to backsides of the first electrode parts 4a among the ten pieces of the long and narrow electrical conduction patterns 5d which constitute a part of the second electrical conduction patterns 5 also exhibit the same effect as the above-mentioned dummy electrodes 5c. Therefore, in the third wiring board, these part corresponding to the backsides of the first electrode parts 4a are also regarded as the dummy electrodes 5c. Namely, the second electrical conduction patterns 5 are constituted by the twenty-six pieces of the electrical conduction patterns, which consist of the dummy electrodes 5c only, and the electrical conduction patterns, which include the parts regarded as the dummy electrodes 5c and the long and narrow electrical conduction patterns 5d.

In the third wiring board, the first electrical conduction patterns 4 and the second electrical conduction patterns 5 are electrically connected with each other through the through holes 3d. In the through holes 3d, the insulation substrate 3 which insulates the first electrical conduction patterns 4 from the second electrical conduction patterns 5 is removed. By preparing electrical conductors in the through holes 3d, the first electrical conduction patterns 4 and the second electrical conduction patterns 5 can be electrically connected through the through holes 3d. As a means for ensuring electrical connection through the through hole 3d, well-known means such as a jumper wire, an eyelet, conductive paste or plating can be employed, for example.

In accordance with the third wiring board, the first electrical conduction patterns 4 electrically connected with the bumps 2a of the bare chip 2 and the second electrical conduction patterns 5 prepared on the second surface 3b of the insulation substrate 3 can be electrically connected through the through holes 3d prepared in the inside of the mounting region 3c. All of these electrical conduction patterns are prepared so as to detour to avoid the outside of the mounting region 3c on the first surface 3a of the insulation substrate 3, namely, a region where there is a possibility that contact with the edge of the bare chip 2 may occur. Therefore, in accordance with this configuration, it is possible to transfer electrical signals between the bare chip 2 and other devices, etc., while preventing malfunction of the bare chip 2 due to unexpected electrical connection.

Fourth Embodiment

A flexible printed wiring board according to the fourth embodiment of the present invention (which may be referred to as a "fourth wiring board" hereafter) is the above-mentioned third wiring board, wherein the first electrical conduction patterns 4 comprise one or more first lands 4b, and the second electrical conduction patterns 5 comprise one or more second lands 5b. Furthermore, the first lands 4b and the second lands 5b are electrically connected with each other through the through holes 3d. An example of the first land 4b is shown in FIG. 1, and an example of the second land 5b is shown in FIG. 4, respectively.

Originally, "land" is a term referring to a conductive pattern for soldering, which is prepared around a surface of a hole where a lead wire of a component for through hole mounting is inserted and has a circular or square shape, for example. On the other hand, in the fourth wiring board, electrical conduction patterns prepared around surfaces of the through holes 3d prepared for electrical connection between the first electrical conduction patterns 4 and the second electrical conduction patterns 5 are referred to as "lands." The first lands 4b exemplified in FIG. 1 are circular electrical conduction patterns prepared around openings of the through holes 3d in the first surface 3a, in the first electrical conduction patterns 4. Similarly, the second lands 5b exemplified in FIG. 4 are circular electrical conduction patterns prepared around openings of the through holes 3d in the second surface 3b, in the second electrical conduction patterns 5.

Figure 5:
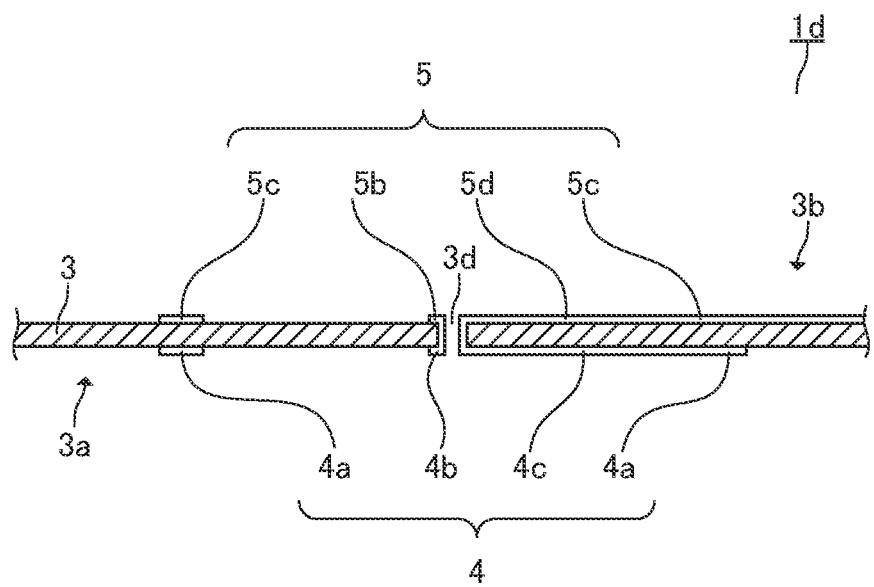
FIG. 5 is a partial sectional view for showing an example of a flexible printed wiring board according to a fourth embodiment of the present invention (fourth wiring board).

FIG. 5 is a partial sectional view for showing an example of the fourth wiring board. In the fourth wiring board 1d exemplified in FIG. 5, the first electrical conduction pattern 4 comprises the first land 4b, and the second electrical conduction pattern 5 comprises the second land 5b. Furthermore, the first land 4b and the second land 5b are electrically connected through the through hole 3d. In addition, in the example shown in FIG. 5, the first land 4b and the second land 5b are electrically connected by preparing a plating layer covering the first land 4b, the second land 5b, and an inner peripheral surface of the through hole 3d. However, as mentioned above, means for ensuring electrical connection between the first land 4b and the second land 5b through the through hole 3d is not limited to this. For example, the first land 4b and the second land 5b can be made to conduct through the through hole 3d by joining the first land 4b and the second land 5b with a jumper wire inserted into the through hole 3d, fitting an eyelet into the through hole 3d, or filling the through hole 3d with conductive paste.

By preparing a land around the opening of the through hole 3d, width of the electrical conduction pattern around the opening of the through hole 3d can be made wider. Thereby, it becomes possible to electrically connect the first electrical conduction patterns 4 and the second electrical conduction patterns 5 more certainly. For example, when the first electrical conduction patterns 4 and the second electrical conduction patterns 5 are electrically connected by plating, area of a part where an electrical conductor made by plating contacts with the electrical conduction pattern becomes larger due to presence of the land. Thereby, electrical resistance of the electrical connection part falls and reliability in mounting the bare chip 2 on the flexible printed wiring board 1 can be improved.

Fifth Embodiment

As explained above, in the flexible printed wiring boards according to various embodiments of the present invention, including the first wiring board to the fourth wiring board (present invention wiring boards), the first electrical conduction patterns are prepared only in the inside of the mounting region on the first surface. Therefore, since the first electrical conduction pattern does not contact with the edge of the bare chip even when the present invention wiring board is bent in the outside of the mounting region, malfunction of the bare chip due to unexpected electrical connection can be prevented certainly.

On the other hand, in the third wiring board and the fourth wiring board, as mentioned above, the second electrical conduction patterns are prepared on the second surface, and the first electrical conduction patterns and the second electrical conduction patterns are electrically connected with each other through the through holes. Thus, the second electrical conduction patterns are disposed on the opposite side to the first surface on which the bare chip is mounted (namely, second surface). Therefore, even when the second electrical conduction patterns extend to the outside of the mounting region on the second surface, as exemplified in FIG. 4, for example, there is no possibility that the second electrical conduction pattern may contact with the edge of the bare chip when the flexible printed wiring board is bent.

Figure 12:
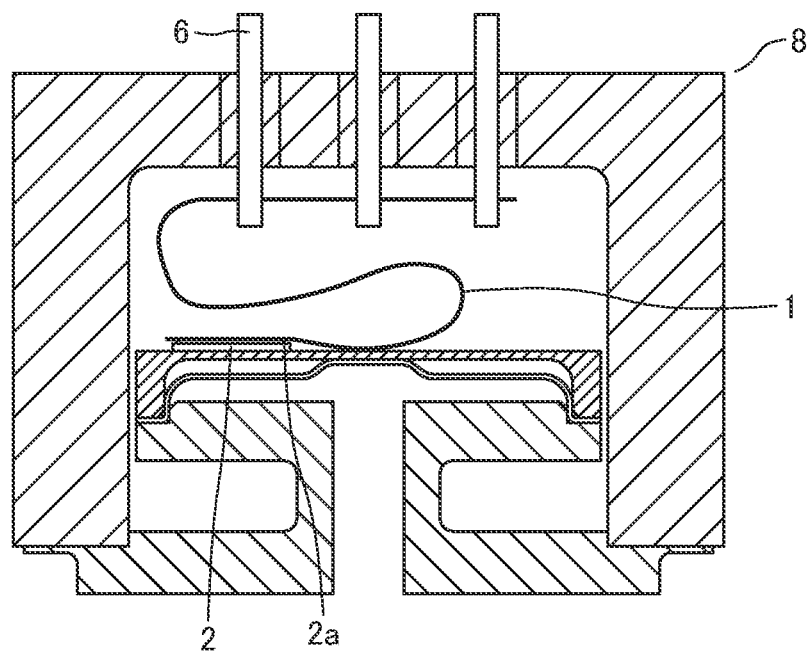
FIG. 12 is an entire sectional view for showing an example of a pressure sensor which has the joined body according to the present invention.

However, when the flexible printed wiring board 1 is largely bent as exemplified in FIG. 12, for example, there is a possibility that the second electrical conduction pattern 5 may be electrically connected with a surrounding member (for example, a housing or an elastic member, etc.) or the second electrical conduction patterns 5 may be electrically connected with each other, and thereby unexpected malfunction of the bare chip 2 may occur.

Then, a flexible printed wiring board according to a fifth embodiment of the invention (which may be referred to as a "fifth wiring board" hereafter) is the third wiring board or the fourth wiring board mentioned above, which further comprises an insulating layer prepared so as to cover at least a part of the second electrical conduction patterns.

A material which constitutes the above-mentioned insulating layer is not particularly limited, as long as it is an insulating material which can reduce unexpected electrical connection between the second electrical conduction patterns and other members and/or unexpected electrical connection between the second electrical conduction patterns as described above. For example, the above-mentioned insulating layer may be a thin film constituted by a flexible insulating material like the above-mentioned insulation substrate. In this case, the above-mentioned insulating layer can be prepared in a predetermined region by sticking such a film with an adhesive, for example. Moreover, as a specific example of a material which constitutes such a film, polyester or a polyimide, etc. can be mentioned, for example. Alternatively, the above-mentioned insulating layer may be an insulation coating (resist) which consists of an insulating material applied to a predetermined region.

A region where the above-mentioned insulating layer is prepared is also not particularly limited, as long as it is possible to reduce unexpected electrical connection between the second electrical conduction patterns and other members and/or unexpected electrical connection between the second electrical conduction patterns as mentioned above. For example, the above-mentioned insulating layer may be prepared only in a region where unexpected electrical connection between the second electrical conduction patterns and other members and/or unexpected electrical connection between the second electrical conduction patterns as mentioned above may occur. Alternatively, the above-mentioned insulating layer may be prepared on all surfaces of the second electrical conduction patterns except for parts where electrical connections between the second electrical conduction patterns and other members are to be made (for example, circumference of openings of the though holes, the second lands, and second electrode parts which will be mentioned later, etc.). Alternatively, the above-mentioned insulating layer may be prepared on an entire surface of the second surfaces except for parts where electrical connections between the second electrical conduction patterns and other members are to be made.

Thickness and configuration material, etc. of the above-mentioned insulating layer can be properly determined according to characteristics (for example, a flexibility, a heat resistance, an abrasion resistance property, etc.) required by the fifth wiring board in a use to which the fifth wiring board is applied.

Figure 6:
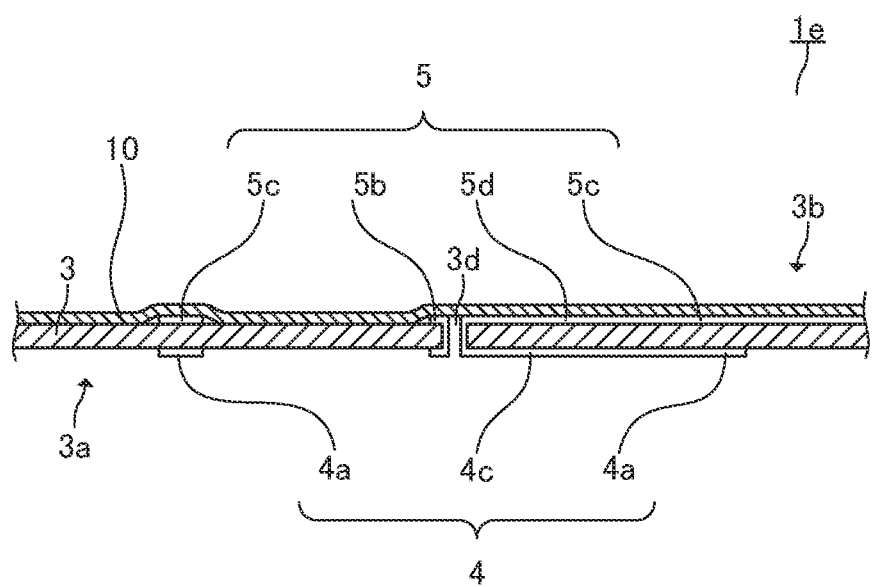
FIG. 6 is a partial sectional view for showing an example of a flexible printed wiring board an according to a fifth embodiment of the present invention (fifth wiring board).

FIG. 6 is a partial sectional view for showing an example of the fifth wiring board. The fifth wiring board 1c exemplified in FIG. 6 has the same configuration as the fourth wiring board 1d exemplified in FIG. 5, except that it further comprises an insulation layer 10 (to which downward-sloping hatching is applied) prepared on the entire second surface 3b of the insulation substrate 3. As shown in FIG. 6, in the part where the first electrical conduction pattern 4 is formed on the first surface 3a, a four layer structure which consists of the first electrical conduction pattern 4, the insulation substrate 3, the second electrical conduction pattern 5 and the insulating layer 10 is formed.

In the fifth wiring board 1c exemplified in FIG. 6, the insulating layer 10 is constituted by a polyimide film similarly to the insulation substrate 3, and it is joined (pasted) with an adhesive so as to cover the entire second surface 3b except for an electrode part which is not shown. Thickness of the insulating layer 10 shown in this example is about half (for example, 12.5 micrometers) the thickness of the insulation substrate 3, and it has been confirmed that it exhibits sufficient flexibility in a pressure-sensor 8 shown in FIG. 10, for example.

As the above, the fifth wiring board 1c is a flexible printed wiring board which further comprises the insulating layer 10 prepared so as to cover at least a part of the second electrical conduction patterns 5. Thereby, even when the flexible printed wiring board is largely bent as exemplified in FIG. 10, for example, the possibility that the second electrical conduction pattern 5 may contact with a surrounding member (for example, a housing or an elastic member, etc.) or the second electrical conduction patterns may contact with each other can be reduced. As a result, unexpected malfunction of the bare chip 2 due to unexpected electrical connection associated with the contact between the second electrical conduction pattern 5 and the surrounding member and/or contact between the second electrical conduction patterns 5 as mentioned above can be reduced.

Moreover, a distance between the second electrical conduction pattern 5 and the surrounding member and/or a distance between the second electrical conduction patterns 5 may become significantly smaller due to the bending of the flexible printed wiring board, even when the contact between the second electrical conduction pattern 5 and the surrounding member and/or the contact between the second electrical conduction patterns 5 do not occur. There is a possibility that an electrical discharge may occur between the second electrical conduction pattern 5 and the surrounding member and/or between the second electrical conduction patterns 5 to cause unexpected malfunction of the bare chip 2 due to the electrical discharge, when a noise with a high voltage is generated in such a case, for example. However, in the fifth wiring board 1e, stiffness as a flexible printed wiring board can be improved by further comprising the insulating layer 10. Therefore, flexure associated with the bending of the flexible printed wiring board can be reduced and the distance between the second electrical conduction pattern 5 and the surrounding member and/or between the second electrical conduction patterns 5 can be prevented from becoming excessively small. As a result, generation of the electrical discharge as mentioned above can be reduced and unexpected malfunction of the bare chip 2 due to the electrical discharge, etc. can be reduced.

Sixth Embodiment

Figure 7:
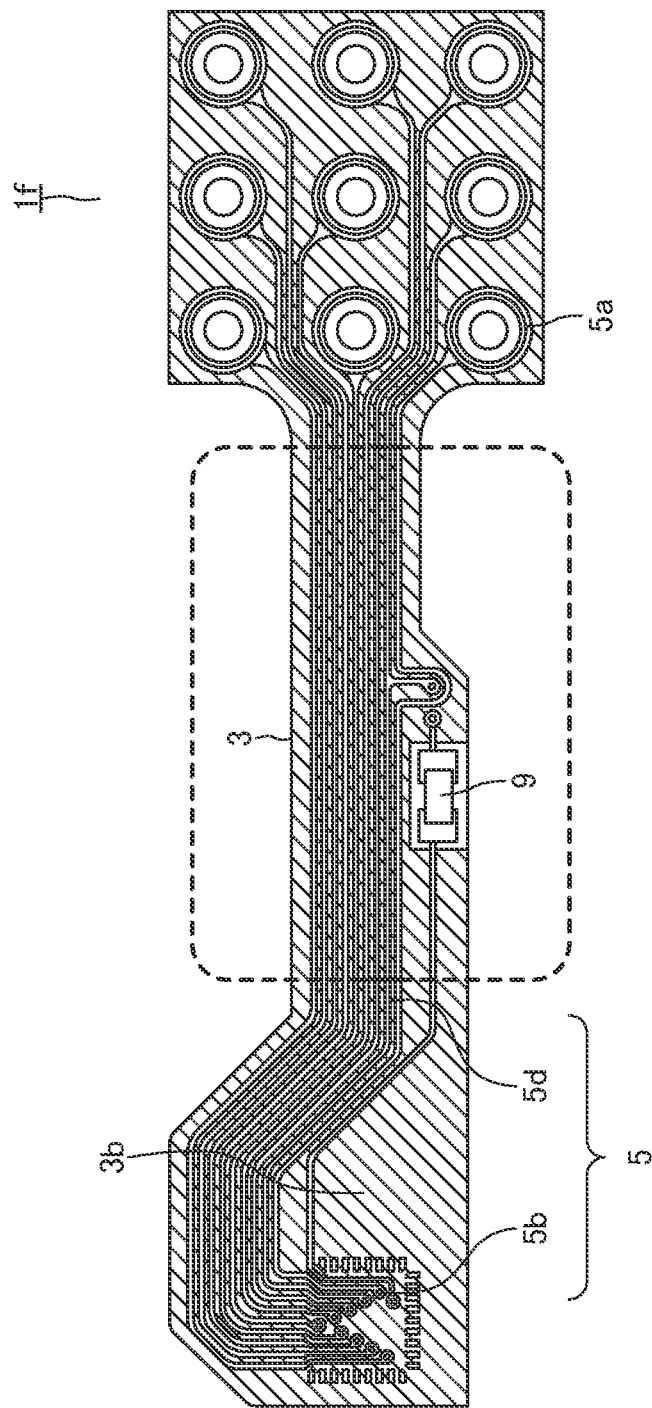
FIG. 7 is an entire schematic view for showing an example of a flexible printed wiring board an according to a sixth embodiment of the present invention (sixth wiring board).

The flexible printed wiring board according to a sixth embodiment of the present invention (which may be referred to as a "sixth wiring board" hereafter) is any one of the above-mentioned third to fifth wiring boards, wherein the second electrical conduction pattern 5 comprises a second electrode part 5a for electrically connecting with an external electrode 6. FIG. 7 is an entire schematic view for showing an example of the sixth wiring board 1f. In FIG. 7, the second electrical conduction patterns 5 prepared on the second surface 3b side of the insulation substrate 3 are shown. On the left side of the sixth wiring board 1f shown in FIG. 7, there is a part where the bare chip 2 is mounted, and positions of the ten pieces of the second lands 5b are shown. On the right side of the sixth wiring board 1f shown in FIG. 7, positions of the nine pieces of the second electrode parts 5a are shown.

For each of the second electrode parts 5a, a through hole is prepared, and an external electrode 6, which is not shown, is inserted into the through hole. The external electrode 6 and the second electrode part 5a can be electrically connected with each other by a well-known means such as soldering. The second electrode part 5a can be prepared according to a size of the external electrode 6. By preparing the second electrode part 5a, it is possible to ensure the electrical connection between the bump 2a of the bare chip 2 and the external electrode 6 even when a size of a region where the external electrode 6 is arranged is significantly larger as compared with a size of a region where the bump 2a of the bare chip 2 is arranged. In the example shown in FIG. 7, 9 of the ten pieces of the second lands 5b and the nine pieces of the second electrodes 5a are electrically connected individually by the nine pieces of the long and narrow electrical conduction patterns 5d which constitute the second electrical conduction patterns 5.

In the sixth wiring board 1f shown in FIG. 7, distances between the second lands 5b and the second electrode parts 5a are ensured to be long, and a part of the second electrical conduction patterns located in a central part of the sixth wiring board 1f can be freely bent. By using the sixth wiring board 1f having such a configuration, regardless of a relative positional relation between the bare chip 2 and the external electrodes 6, they can be electrically connected with each other easily. At the positions where the second electrode parts 5a are prepared, a protective plate (support plate) composed of a rigid body, which is not shown, can be prepared, for the purpose of making it easier to assemble with the external electrodes 6, for example.

In FIG. 7, the nine pieces of the long and narrow electrical conduction patterns 5*d* which electrically connect the second lands 5*b* with the second electrode parts 5*a* are prepared so as to extend from the inside of the mounting region 3*c*, not shown, toward the outside. In this case, these long and narrow electrical conduction patterns 5*d* are not extended toward a direction parallel to a direction connecting the second lands 5*b* and the second electrode parts 5*a*, but extend toward a direction perpendicular to the direction connecting the second lands 5*b* and the second electrode parts 5*a*, namely, upward in FIG. 7. When the sixth wiring board 1*f* is bent in a left-right direction in FIG. 7, the sixth wiring board f is hardly bent in an up-down direction in FIG. 7. In other words, when the sixth wiring board 1*f* is bent around an axis extending in an up-down direction in FIG. 7, the sixth wiring board 1*f* will not be bent around an axis extending in a left-right direction in FIG. 7. For this reason, malfunction of the bare chip 2 due to the left-right bending of the sixth wiring board 1*f* can be prevented more certainly by extending the long and narrow electrical conduction patterns 5*d* of the second electrical conduction patterns 5 toward the direction perpendicular to a direction of a straight line connecting the second lands 5*b* and the second electrode parts 5*a*.

In the sixth wiring board 1*f* shown in FIG. 7, one of the ten pieces of the second lands 5*b* is connected with a chip resistor 9 through one piece of the long and narrow electrical conduction patterns 5*d*. The chip resistor 9 has a function for adjusting a voltage of a control signal supplied from the external electrode 6, which is not shown, and applying the voltage to the bare chip 2. This control signal is used to switch operation modes of the bare chip 2, or to fix the operation mode, for example. Such a chip resistor 9 can be prepared not only in the sixth wiring board 1*f* but also in the present invention wiring boards according to various embodiments. A protective plate (support plate) made of a rigid body, which is not shown, may be also prepared at a part where the chip resistor 9 is prepared in such present invention wiring boards, for the purpose of preventing damage to the chip resistor 9 and/or to release of electrical connection (disconnection) due to excessive bending.

Seventh Embodiment

By the way, as mentioned above in the present specification, the present invention relates not only to flexible printed wiring boards according to various embodiments of the present invention including the above-mentioned first to sixth wiring boards, but also to a joined body which comprises the present invention wiring board and the bare chip. A joined body according to the seventh embodiment of the present invention (which may be referred to as a "seventh joined body" hereafter) is a joined body comprising a bare chip and the present invention wiring board of any one of the above mentioned first wiring board 1*a* to the sixth wiring board 1*f*. The present invention wiring board has been created on the assumption that one or more bare chips are mounted on the first surface 3*a*. The joined body according to the present invention (present invention joined body) is a composite wherein the bare chip is actually mounted on the present invention wiring board. A part of the flexible printed wiring board in the present invention joined body comprises the above-mentioned configuration of the present invention wiring board. Therefore, by joining the bare chip 2 to this, the same action and effect as those of the present invention wiring board can be achieved.

Figure 8:
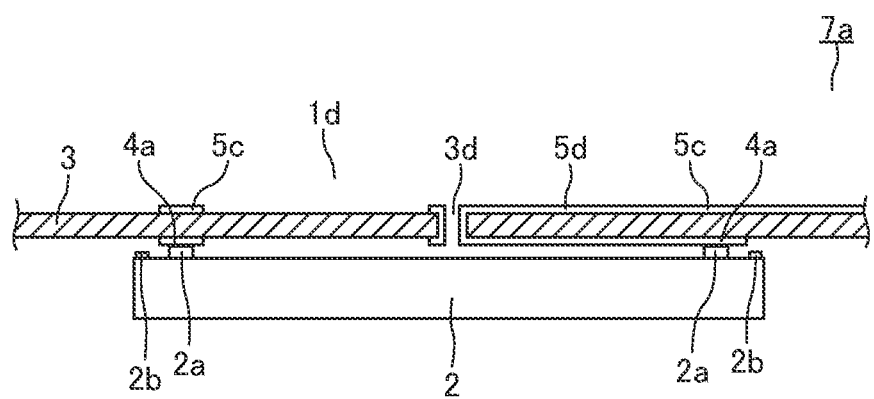
FIG. 8 is a partial sectional view for showing an example of a joined body according to a seventh embodiment of the present invention (seventh joined body) comprising the fourth wiring board and a bare chip.

FIG. 8 is a partial sectional view of an example of the seventh joined body 7*a* comprising the bare chip 2 and the fourth wiring board 1*d* shown in FIG. 5 among the present invention wiring boards according to various embodiments. In FIG. 8, a joined part between the flexible printed wiring board 1 and the bare chip 2 is enlarged and illustrated. The bumps 2*a* of the bare chip 2 and the first electrodes 4*a* of the first electrical conduction patterns 4, which are prepared at positions opposite to the bumps 2*a*, are electrically connected with each other, and they are joined at least at these electrically connected parts. As a means for electrically connecting the bump 2*a* and the first electrode part 4*a*, conductive paste, solder or other well-known means can be employed. Moreover, as mentioned above, as a means for ensuring electrical connection between the first land 4*b* and the second land 5*b* through the through hole 3*d*, a jumper wire, an eyelet, conductive paste or plating, which are not shown, can be employed, for example.

Figure 9:
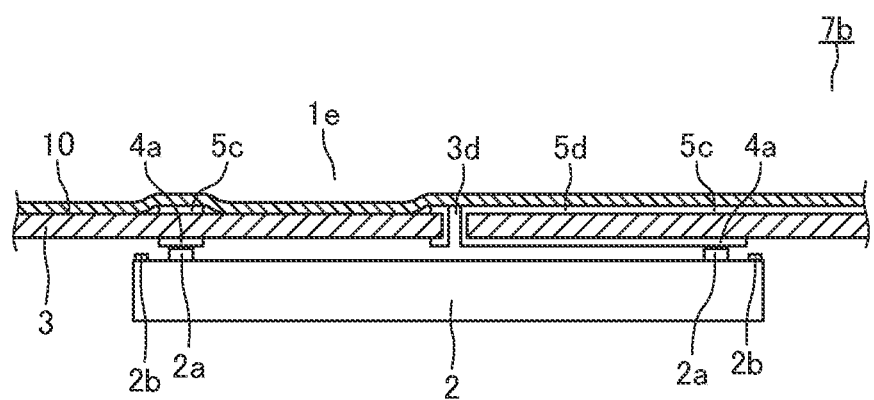
FIG. 9 is a partial sectional view for showing an example of the seventh joined body comprising the fifth wiring board and a bare chip.

FIG. 9 is a partial sectional view for showing an example of the seventh joined body 7*b* comprising the bare chip 2 and the fifth wiring board 1*c* shown in FIG. 6 among the present invention wiring boards according to various embodiments. In FIG. 9, as a flexible printed wiring board, the fifth wiring board 1*c* which further comprises the insulating layer 10 prepared so as to cover at least a part of the second electrical conduction patterns 5 is used in place of the fourth wiring board 1*d*. Thereby, even when the flexible printed wiring board is largely bent as exemplified in FIG. 12, for example, a possibility that electrical connection between the second electrical conduction pattern 5 and a surrounding member or electrical connection between the second electrical conduction patterns 5 may occur can be reduced. As a result, a possibility that unexpected malfunction of the bare chip 2 due to unexpected electrical connection as mentioned above can be reduced.

Moreover, as mentioned above, stiffness of the fifth wiring board 1*c* can be improved by further comprising the insulating layer 10. Therefore, flexure associated with the bending of the fifth wiring board 1*c* can be reduced, and excessive proximity of the second electrical conduction pattern 5 and a surrounding member and/or excessive proximity of the second electrical conduction patterns 5 can be prevented. As a result, even when a noise with a high voltage is generated, generation of an electrical discharge between the second electrical conduction pattern 5 and a surrounding member and/or an electrical discharge between the second electrical conduction patterns 5 can be reduced, and unexpected malfunction of the bare chip 2 due to the electrical discharge, etc. can be reduced.

Eighth Embodiment

A joined body according to the eighth embodiment of the present invention (which may be referred to as an "eighth joined body" hereafter) is the above-mentioned seventh joined body, wherein electrical connection between the bump 2*a* and the first electrode part 4*a* is attained by an anisotropic conductive film (ACF). An anisotropic conductive film is a film obtained by forming into a shape of film a thermosetting resin in which fine metal particles with an insulation layer on the surfaces are mixed and dispersed. When an anisotropic conductive film is sandwiched between the bump 2*a* and the first electrode part 4*a* and pressure is applied while heating with a heater, etc., the fine metal particles dispersed in the film contact with each other to break the insulation at a part where large pressure was applied, and a conduction path (electrical connection path) is formed. Since an electrical connection is interrupted by the insulating layer at a part where the pressure was not applied, insulation is held. Since electrical connection between many electrodes can be realizable by once applying heat and pressure when using an anisotropic conductive film, a manufacturing cost of the present invention joined bodies including the above-mentioned seventh joined bodies 7a and 7b can be suppressed.

Figure 10:
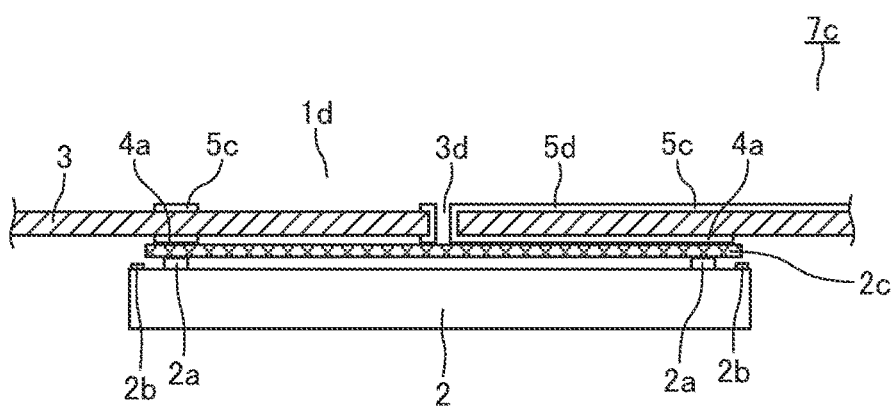
FIG. 10 is a partial sectional view for showing an example of a joined body according to an eighth embodiment of the present invention (eighth joined body) consisting of the fourth wiring board and a bare chip electrically connected with each other through an anisotropic conductive film.
Figure 11:
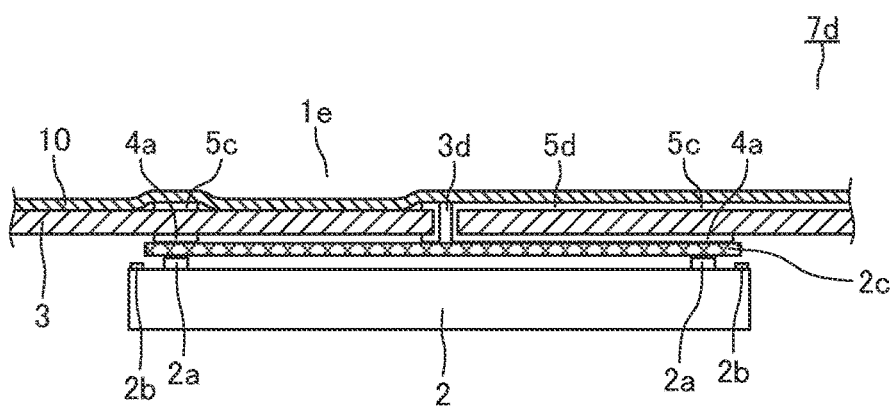
FIG. 11 is a partial sectional view for showing an example of a joined body according to the eighth embodiment of the present invention (eighth joined body) consisting of the fifth wiring board and a bare chip electrically connected with each other through an anisotropic conductive film.

In the eighth joined body 7c and 7d exemplified in FIG. 10 and FIG. 11, the dummy electrodes 5c are formed in the backside of the first electrode parts 4a (namely, the second surface 3b that is a surface opposite to the first surface 3a). By preparing the dummy electrodes 5c projecting from the second surface 3b of the insulation substrate 3, the pressure applied to the anisotropic conductive film 2c sandwiched between the bumps 2a and the first electrode parts 4a is increased locally as compared with a case where the dummy electrodes 5c are not formed. Thereby, the electrical connection by the anisotropic conductive film 2c can be realized more certainly. Since there is no projection part in parts other than the bumps 2a and the first electrode parts 4a, an upper surface of the bare chip 2 and the first conductor patterns 4 never be electrically connected with each other. For the purpose of more certainly preventing electrical connection between the upper surface of the bare chip 2 and the first conductor patterns 4, an insulation coating (resist) may be prepared on a region exclusive of the bumps 2a on the surface of the bare chip 2.

By the way, in a case where there is a point where the insulation coating prepared on the upper surface of the bare chip 2 is damaged or exfoliated (peeled off) for some reason, when large pressure is applied to the anisotropic conductive film 2c at the point, there is a possibility that the fine metal particles distributed inside the anisotropic conductive film 2c may enter the point and contact with each other to break the insulation. Then, an insulation coating (resist) may be further prepared at least a part of a region exclusive of the first electrode parts 4a of the mounting region 3c on the first surface 3a (for example, a part surrounded by the first electrode parts 4a). Thereby, the electrical connection between the upper surface of the bare chip 2 and the first conductor patterns 4 can be prevented more certainly.

Ninth Embodiment

By the way, as mentioned above in the present specification, the present invention relates not only to flexible printed wiring boards according to various embodiments of the present invention including the above-mentioned first to sixth wiring boards (present invention wiring boards) and joined bodies according to various embodiments of the present invention including the seventh joined body and the eighth joined body (present invention joined bodies), but also to a pressure sensor which has a present invention joined body. A pressure sensor according to the ninth embodiment of the present invention (which may be referred to as a "ninth sensor" hereafter) is a pressure sensor which has the present invention joined body including the above-mentioned seventh joined body or eighth joined body, wherein the bare chip is a strain sensor.

FIG. 12 is an entire sectional view for showing an example of a pressure sensor 8 as the ninth sensor which has a present invention joined body. The pressure sensor 8 comprises a diaphragm which defines a space in communication with a flow path of a fluid whose pressure is to be measured. Furthermore, a bare chip 2, which is a strain sensor, is joined to a surface of the diaphragm or an elastic member mechanically joined to the diaphragm. Pressure of the fluid can be measured by detecting a deformation of the diaphragm caused according to the pressure of the fluid with the strain sensor. As the bare chip 2 that is a strain sensor, a strain sensor which comprises a plurality of resistive elements described in the Patent Document 4 (PTL4) can be used, for example. By configuring airtight a part on a side of the diaphragm, which is not in contact with the fluid, an absolute pressure sensor which is not affected by atmospheric pressure in the outside of the pressure sensor 8 can be realized.

As the flexible printed wiring board 1 which electrically connect the bare chip 2 and the external electrodes 6, the present invention wiring boards such as the sixth wiring board 1f exemplified in FIG. 7 can be used, for example. By sandwiching an anisotropic conductive film between the bare chip 2 and the flexible printed wiring board 1 and applying heat and pressure to them, the present invention joined body comprising both of these can be assembled. Next, after electrically connecting the second electrode parts 5a and the external electrodes 6 exemplified in FIG. 7, for example, the flexible printed wiring board 1 is largely bent to be inserted into a narrow space of a housing. Thereafter, the housing is welded. Thus, the pressure sensor 8 shown in FIG. 12 can be assembled.

The flexible printed wiring board 1 housed in an airtight space of the pressure sensor 8 exemplified in FIG. 12 is largely bent at two points. Due to this bending, the flexible printed wiring board 1 is deformed in the vicinity of the bare chip 2 such that the first surface 3a of the insulation substrate 3 gets closer to a surface of the elastic body mechanically joined to the diaphragm. However, on the first surface 3a of the insulation substrate 3 which constitutes the present invention wiring board as the flexible printed wiring board 1, the first electrical conduction patterns 4 are prepared only inside the mounting region 3c of the bare chip 2 and no electrical conduction pattern is prepared in other parts. Moreover, the second electrical conduction patterns 5 are prepared on the opposite side to the first surface 3a of the insulation substrate 3. Therefore, no matter how the flexible printed wiring board 1 is bent, the first electrical conduction patterns 4 and the second electrical conduction patterns 5 never be electrically connected with the edge of the bare chip 2. Thereby, a very reliable pressure sensor 8 can be manufactured.

Tenth Embodiment

By the way, as mentioned above in the present specification, the present invention relates not only to flexible printed wiring boards according to various embodiments of the present invention including the above-mentioned first to sixth wiring boards (present invention wiring boards), joined bodies according to various embodiments of the present invention including the seventh joined body and the eighth joined body (present invention joined bodies), and sensors according to various embodiments of the present invention including the ninth sensor (present invention sensor), but also to a mass flow controller which has a present invention sensor. A mass flow controller according to the tenth embodiment of the present invention (which may be referred to as a "tenth apparatus" hereinafter) is a mass flow controller which has a present invention sensor including the above-mentioned ninth sensor as a pressure sensor and monitors pressure of a fluid by the pressure sensor.

For example, the present invention apparatus comprises a fluid flow path formed in a body, a means for monitoring a flow rate of the fluid flowing through the flow path, a present invention sensor (for example, the pressure sensor 8) as a means for monitoring pressure of the fluid, and a means for controlling the flow rate of the fluid. The present invention sensor may constitute a part of the means for monitoring the flow rate of the fluid. In accordance with the present invention, it becomes possible to improve accuracy of measurement of the fluid flow rate and/or to accurately control the fluid flow rate in response to pressure changes by using a mass flow controller in which the present invention sensor with a high reliability is included to accurately monitor the pressure of the fluid.

Working Example

Effects of the present invention will be explained in detail by a working example shown below. The following explanation is only a specific exemplification of the effects of the present invention, and embodiments of the present invention are not limited to contents of the working example described below.

(1) Configuration of Sensor for Evaluation

Using a flexible printed wiring board according to the present invention (present invention wiring board) and a flexible printed wiring board according to a conventional technology (conventional wiring board) and bare chips which are strain sensors, a working examples 1 and 2 which are pressure sensors according to the present invention and a comparative example 1 which is a pressure sensor according to the conventional technology are manufactured as sensors for evaluation, respectively.

Specifically, as listed in Table 1 which will be mentioned later, in the working example 1 and the working example 2, the sixth wiring board 1f exemplified in FIG. 7 is adopted as a flexible printed wiring board, and the bare chip 2 exemplified in FIG. 2 is adopted as a strain sensor. A bare chip 2 in which the test electrodes 2b do not exist on a surface where the bumps 2a are formed is adopted in the working example 1, and a bare chip 2 in which the test electrodes 2b exist on the surface where the bumps 2a are formed is adopted in the working example 2.

On the other hand, in the comparative example 1, the flexible printed wiring board according to the conventional technology, which is exemplified in FIG. 3 (conventional wiring board 1') is adopted as a flexible printed wiring board, the bare chip 2 exemplified in FIG. 2 is adopted as a strain sensor. A bare chip 2 in which the test electrodes 2b do not exist on the surface where the bumps 2a are formed and a bare chip 2 in which the test electrodes 2b exist on the surface where the bumps 2a are formed are used together in the comparative example 1.

In accordance with the above-mentioned configuration, the first electrical conduction patterns are prepared only inside of the mounting region 3c of the first surface 3a of the flexible printed wiring board in the working example 1 and the working example 2, while the first electrical conduction patterns are prepared not only inside the mounting region 3c of the first surface 3a of the flexible printed wiring board, but also outside the mounting region 3c in the comparative example 1. In addition, in any of the working example 1, the working example 2 and the comparative example 1, a shape of the mounting region 3c of the bare chip 2 is a square with a length of 2.5 millimeters on each side.

(2) Preparation of Flexible Printed Wiring Board

A procedure for preparing a flexible printed wiring board used for each of the sensors for evaluation will be explained below. First, a cooper clad laminate with rolled cooper foil having a thickness of 10 micrometers laminated on the first surface 3a and the second surface 3b of the insulation substrate 3 made of polyimide film having a thickness of 30 micrometers is prepared, and the through holes 3d are drilled. Thereafter, a state where electrical connections between the side of the first surface 3a and the side of the second surface 3b through the through holes 3d are possible are attained by a plating processing treatment of the through holes.

Next, as for the working example 1 and the working example 2, after printing a resist pattern corresponding to the first electrical conduction patterns 4 exemplified in FIG. 1 and the second electrical conduction patterns 5 exemplified in FIG. 4, rolled copper foil in unnecessary parts is removed by etching. Next, a polyimide film is joined (pasted) with an adhesive to parts exclusive of the first electrode parts 4a of the first electrical conduction patterns 4 and the second electrode parts 5a of the second electrical conduction patterns 5. Namely, in the sixth wiring board 1f which the working example 1 and the working example 2 comprise, the insulating layer 10 which the fifth wiring board 1c exemplified in FIG. 6 comprises is formed of a polyimide film. Furthermore, a nickel plating layer with a thickness of 1 micrometer and a gold plating layer with a thickness of 0.03 micrometer are sequentially formed by nonelectrolytic plating on surfaces of the first electrode parts 4a and the second electrode parts 5a, respectively.

On the other hand, as for the comparative example 1, after printing a resist pattern corresponding to the first electrical conduction patterns 4' exemplified in FIG. 3, rolled copper foil in unnecessary parts is removed by etching. Next, a resist pattern is printed on parts exclusive the first electrode parts 4a' of the first electrical conduction patterns 4'. However, since it was technically difficult to accurately prepare the resist pattern (insulation coating) so as to avoid only positions opposite to the bumps 2a as mentioned above, in the comparative example 1, parts where the first electrical conduction patterns 4' are exposed in the vicinity of the mounting region 3c are formed. Furthermore, a nickel plating layers with a thickness of 1 micrometer is sequentially formed by nonelectrolytic plating on surfaces of the first electrode parts 4a' similarly to the working example 1 and the working example 2.

(3) Assembly of Joined Body

Next, the sensors for evaluation according to the working example 1, the working example 2 and the comparative example 1 are assembled by assembling pressure sensors 8 exemplified in FIG. 12 using the above-mentioned various flexible printed wiring boards and the bare chip 2 respectively.

Specifically, a diaphragm prepared in a main body so as to define a space in communication with a flow path of a fluid to be measured and an elastic member mechanically joined with the diaphragm are prepared, and a surface of the bare chip 2, on which the bump 2a is not formed is joined to a surface of the elastic member. Next, an anisotropic conductive film is placed on a surface of the bare chip 2, on which the bumps 2a are formed, and then the above-mentioned various flexible printed wiring boards are placed further on the same such that the bare chip 2 and the mounting region 3c overlap with each other (namely, such that the bump 2a of the bare chip 2 overlaps with the first electrode parts 4a or the first electrode parts 4a'). By applying pressure while heating with a heater in a state where alignment has been done in this way, the bumps 2a of the bare chip 2 are electrically connected with the first electrode parts 4a or the first electrode parts 4a' of the various flexible printed wiring boards, and the bare chip 2 is mounted on the various flexible printed wiring boards. Thus, various joined bodies according to the working example 1, the working example 2 and the comparative example 1 are assembled.

(4) Assembly of Sensor for Evaluation

Next, housings which comprise the external electrodes 6 as exemplified in FIG. 12 are prepared, the second electrode parts 5a of the sixth wiring boards 1f which constitutes the joined bodies according to the working example 1 and the working example 2 are electrically joined with the external electrodes 6, respectively. On the other hand, as for the comparative example 1, the electrode parts of the conventional wiring board 1', which is not shown, are electrically joined with the external electrodes 6. Next, while bending the various flexible printed wiring boards, main bodies including various jointed bodies, diaphragms and elastic members are respectively incorporated into the housings, and the main bodies and the housings are respectively welded together to assemble the various sensors for evaluation, as exemplified in FIG. 12. Configurations of the sensors for estimation according to the working example 1, the working example 2 and the comparative example 1, which are assembled in this way, are listed in the following Table 1.

TABLE 1

| | Wiring Board | Test Electrode | Number of Samples | Number of Acceptances | Acceptance Ratio [%] |
|---|---|---|---|---|---|
| Working Example 1 | 1f | None | 59 | 59 | 100 |
| Working Example 2 | 1f | All | 48 | 48 | 100 |
| Comparative Example 1 | 1' | Some | 499 | 480 | 96.2 |

(5) Insulation Evaluation A

For each of the sensors for evaluation according to the working example 1, the working example 2 and the comparative example 1 obtained as mentioned above, electrical resistance values shown in the following a) and b) are measured, and those whose detected electrical resistance values exceeded respective standard values are judged as "acceptance (success)", and those whose detected electrical resistance values are the respective standard values or less are judged as "nonacceptance (failed)." Judgment results of the respective sensors for evaluation are also listed in Table 1.

a) Measurement of Electrical Resistance Value Between External Electrodes

Electrical resistance between one external electrode electrically connected with the ground of the bare chip 2 among the external electrodes 6 and other 8 external electrodes are measured using a digital multimeter.

b) Measurement of Electrical Resistance Value Between External Electrode and Housing Electrical resistance between the housing and the 9 external electrodes 6 of the sensors for evaluation is measured using the same measuring instrument (digital multimeter) as the above-mentioned a) and an insulation resistance tester (applied voltage=125V).

As for the sensors for evaluation according to the working example 1 and the working example 2, as a result of the above-mentioned electrical resistance value measurement a), electrical resistance values larger than 3 MΩ were detected in all the sensors for evaluation. Moreover, as a result of the above-mentioned electrical resistance value measurement b) by the digital multimeter, electrical resistance values larger than 600 MΩ were detected in all the sensors for evaluation. Furthermore, as a result of the above-mentioned electrical resistance value measurement b) by the insulation resistance tester, electrical resistance values larger than 250 MΩ were detected in all the sensors for evaluation. Namely, all the sensors for evaluation according to the working example 1 and the working example 2 showed sufficiently large electrical resistance values exceeding detection limits of the measuring instruments.

As the above, it has been confirmed that degradation of electrical resistance value due to unintended electrical connection does not occur in all of the sensors for evaluation according to the working example 1 (59 pieces) and the sensors for evaluation according to the working example 2 (48 pieces) and they are judged as "acceptance (success)." Namely, it has been confirmed that there is no unexpected electrical connection not through the bumps 2a between the first electrical conduction patterns 4 and the bare chip 2 in a pressure sensor wherein the bare chip 2 is mounted on the flexible printed wiring board according to the present invention (present invention wiring board) with the first electrical conduction patterns prepared only in the inside of the mounting region 3c on the first surface 3a.

On the other hand, as for the sensor for evaluation according to the comparative example 1, as a result of the above-mentioned electrical resistance measurements a) and b), although 480 pieces of the 499 pieces of the sensors for evaluation were judged as "acceptance (success)" while the remaining 19 pieces are judged as "nonacceptance (failed)" since they exhibited resistance values equal to the standard value or less. Namely, it is considered that unexpected electrical connection not through the bumps 2a between the first electrical conduction patterns 4' and the bare chip 2 occurs in a pressure sensor wherein the bare chip 2 is mounted on the flexible printed wiring board according to a conventional technology (conventional wiring board) with the first electrical conduction patterns prepared not only in the inside of the mounting region 3c but also in the outside of the mounting region 3c on the first surface 3a.

(6) Insulation Evaluation B

Next, the sensors for evaluation according to the working example 2, which comprise the present invention wiring board and the bare chip 2 with test electrodes, are chosen as sensors for evaluation according to a working example 3, and the sensors which were judged as "acceptance (success)" in the above-mentioned insulation evaluation A (namely, evaluation by the above-mentioned electrical resistance value measurements a) and b)) are chosen as sensors for evaluation according to a comparative example 2, among the sensors for evaluation according to the comparative example 1, some of which comprise the conventional wiring board and the bare chips 2 with test electrodes and the rest of which comprise the conventional wiring board and the bare chips 2 without any test electrode.

For each of the sensors for evaluation according to the working example 3 and the comparative example 2 selected as mentioned above, a welded area between the main body and the housing is cut to expose the flexible printed wiring board, and the flexible printed wiring board is bent using tweezers to bring it close to the edge of the bare chip 2 in a state where electrical power is supplied to the bare chip 2.

As a result of the above-mentioned test, as for the sensors for evaluation according to the working example 3, no abnormality in an operation of the bare chip 2 occurred in all the 12 pieces of the sensors (acceptance ratio=100%). On the other hand, as for the sensors for evaluation according to the comparative example 2, the bare chip 2 shifted to a power down mode for circuit protection, and a normal operation could not be continued in all the 12 pieces of the sensors for evaluation (acceptance ratio=0%).

(7) Comprehensive Evaluation

From the above-mentioned results, in the pressure sensors comprising the flexible printed wiring board according to the present invention (present invention wiring board), excellent insulation and reliability could be attained regardless of the presence or absence of test electrodes in the bare chip. From this, it has been confirmed that an unintentional electrical contact of the edge and the test electrode 2b of the bare chip 2 with the electrical conduction pattern of the flexible printed wiring board and an unintentional electrical contact of the housing with the electrical conduction pattern can be prevented certainly in accordance with the present invention wiring board wherein the first electrical conduction patterns 4 are prepared only in the inside of the mounting region 3c of the bare chip 2.

On the other hand, in the pressure sensor which comprises the conventional wiring board wherein the first electrical conduction patterns 4 are prepared not only in the inside of the mounting region 3c of the bare chip 2 but also in the outside, it has been confirmed that an unintentional electrical contact between the external electrodes electrically connected with the electrical conduction patterns and an unintentional electrical contact between the external electrode and the housing cannot be prevented certainly (insulation evaluation A). Moreover, it has been confirmed that abnormal operation of the bare chip 2 occurs in all the sensors when the flexible printed wiring board is bent using tweezers to be brought close to the edge of the bare chip 2. Namely, it has been confirmed that it is difficult to attain excellent insulation and reliability in a pressure sensor which comprises the conventional wiring board.

Although some embodiments and working examples which have specific configurations have been explained, sometimes referring to the drawings, as the above, for the purpose of explaining the present invention, it should not be interpreted that the scope of the present invention is limited to these exemplary embodiments and working examples, and it is needless to say that it is possible to add modifications properly within the limits of matters described in the claims and specification.

The invention claimed is:

1. A flexible printed wiring board having:
    an insulation substrate comprising a first surface that is a surface on which a bare chip is mounted and a second surface that is a surface located on an opposite side of said first surface;
    one or more first electrical conduction patterns which are prepared on said first surface and include first electrode parts arranged at positions where the first electrode part can be electrically connected with a bump of said bare chip in a mounted state that is a state where said bare chip is mounted on said first surface;
    one or more through holes drilled in said insulation substrate, and
    one or more second electrical conduction patterns prepared on said second surface;
    wherein:
    at least a part of said first electrical conduction patterns further comprise a first electrical conduction part that is a part for electrically connecting said first electrode part with said through hole;
    at least a part of said first electrical conduction patterns and at least a part of said second electrical conduction patterns are electrically connected with each other through said through holes; and
    said first electrical conduction patterns are prepared only inside a mounting region that is a region opposite to said bare chip in said mounted state.

2. The flexible printed wiring board according to claim 1, wherein:
    said first electrical conduction patterns comprise one or more first lands;
    said second electrical conduction patterns comprise one or more second lands; and
    said first lands and said second lands are electrically connected with each other through said through holes.

3. The flexible printed wiring board according to claim 2, comprising:
    an insulating layer prepared so as to cover at least a part of said second electrical conduction patterns.

4. The flexible printed wiring board according to claim 3, wherein:
    said second electrical conduction pattern comprises a second electrode part for electrically connecting with an external electrode.

5. The flexible printed wiring board according to claim 2, wherein:
    said second electrical conduction pattern comprises a second electrode part for electrically connecting with an external electrode.

6. The flexible printed wiring board according to claim 1, comprising:
    an insulating layer prepared so as to cover at least a part of said second electrical conduction patterns.

7. The flexible printed wiring board according to claim 6, wherein:
    said second electrical conduction pattern comprises a second electrode part for electrically connecting with an external electrode.

8. The flexible printed wiring board according to claim 1, wherein:
    said second electrical conduction pattern comprises a second electrode part for electrically connecting with an external electrode.

9. The flexible printed wiring board according to claim 1, wherein:
    said bare chip comprises test electrodes, and
    said first electrical conduction patterns are prepared so as to avoid a position opposite to said test electrode.

10. The flexible printed wiring board according to claim 9, wherein:
    said first electrical conduction patterns comprise one or more first lands;
    said second electrical conduction patterns comprise one or more second lands; and
    said first lands and said second lands are electrically connected with each other through said through holes.

11. The flexible printed wiring board according to claim 10, comprising:
    an insulating layer prepared to cover at least a part of said second electrical conduction patterns.

12. The flexible printed wiring board according to claim 11, wherein:
said second electrical conduction pattern comprises a second electrode part for electrically connecting with an external electrode.

13. The flexible printed wiring board according to claim 10, wherein:
said second electrical conduction pattern comprises a second electrode part for electrically connecting with an external electrode.

14. The flexible printed wiring board according to claim 9, comprising:
an insulating layer prepared so as to cover at least a part of said second electrical conduction patterns.

15. The flexible printed wiring board according to claim 14, wherein:
said second electrical conduction pattern comprises a second electrode part for electrically connecting with an external electrode.

16. The flexible printed wiring board according to claim 9, wherein:
said second electrical conduction pattern comprises a second electrode part for electrically connecting with an external electrode.

17. A joined body comprising:
a flexible printed wiring board; and
a bare chip;
wherein the flexible printed wiring board comprises:
an insulation substrate comprising a first surface that is a surface on which a bare chip is mounted and a second surface that is a surface located on an opposite side of said first surface;
one or more first electrical conduction patterns which are prepared on said first surface and include first electrode parts arranged at positions where the first electrode part can be electrically connected with a bump of said bare chip in a mounted state that is a state where said bare chip is mounted on said first surface;
one or more through holes drilled in said insulation substrate; and
one or more second electrical conduction patterns prepared on said second surface;
wherein:
at least a part of said first electrical conduction patterns further comprise a first electrical conduction part that is a part for electrically connecting said first electrode part with said through hole;
at least a part of said first electrical conduction patterns and at least a part of said second electrical conduction patterns are electrically connected with each other through said through holes; and
said first electrical conduction patterns are prepared only inside a mounting region that is a region opposite to said bare chip in said mounted state.

18. The joined body according to claim 17, wherein:
said bare chip comprises test electrodes, and
said first electrical conduction patterns are prepared so as to avoid a position opposite to said test electrode.

19. The joined body according to claim 17, wherein:
said first electrical conduction patterns comprise one or more first lands;
said second electrical conduction patterns comprise one or more second lands; and
said first lands and said second lands are electrically connected with each other through said through holes.

20. The joined body according to claim 17, comprising:
an insulating layer prepared to cover at least a part of said second electrical conduction patterns.

21. The joined body according to claim 17, wherein:
said second electrical conduction pattern comprises a second electrode part for electrically connecting with an external electrode.

22. The joined body according to claim 17, wherein:
an electrical connection between said bump (2a) and said first electrode part (4a) is attained by an anisotropic conductive film.

23. A pressure sensor comprising:
a flexible printed wiring board; and
a strain sensor;
wherein the flexible printed wiring board comprises:
an insulation substrate comprising a first surface that is a surface on which said strain sensor is mounted and a second surface that is a surface located on an opposite side of said first surface;
one or more first electrical conduction patterns which are prepared on said first surface and include first electrode parts arranged at positions where the first electrode part can be electrically connected with a bump of said strain sensor in a mounted state that is a state where said strain sensor is mounted on said first surface;
one or more through holes drilled in said insulation substrate, and
one or more second electrical conduction patterns prepared on said second surface;
wherein:
at least a part of said first electrical conduction patterns further comprise a first electrical conduction part that is a part for electrically connecting said first electrode part with said through hole;
at least a part of said first electrical conduction patterns and at least a part of said second electrical conduction patterns are electrically connected with each other through said through holes; and
said first electrical conduction patterns are prepared only inside a mounting region that is a region opposite to said strain sensor in said mounted state.

24. The pressure sensor of claim 23, wherein:
an electrical connection between said bump and said first electrode part is attained by an anisotropic conductive film.

25. A mass flow controller comprising:
a pressure sensor comprising:
a flexible printed wiring board; and
a strain sensor;
wherein the flexible printed wiring board comprises:
an insulation substrate comprising a first surface that is a surface on which said strain sensor is mounted and a second surface that is a surface located on an opposite side of said first surface;
one or more first electrical conduction patterns which are prepared on said first surface and include first electrode parts arranged at positions where the first electrode part can be electrically connected with a bump of said strain sensor in a mounted state that is a state where said strain sensor is mounted on said first surface;
one or more through holes drilled in said insulation substrate, and one or more second electrical conduction patterns prepared on said second surface;

wherein:

at least a part of said first electrical conduction patterns further comprise a first electrical conduction part that is a part for electrically connecting said first electrode part with said through hole;

at least a part of said first electrical conduction patterns and at least a part of said second electrical conduction patterns are electrically connected with each other through said through holes; and said first electrical conduction patterns are prepared only inside a mounting region that is a region opposite to said strain sensor in said mounted state; and means for monitoring pressure of fluid by said pressure sensor.

26. The mass flow controller of claim 25, wherein:

an electrical connection between said bump and said first electrode part is attained by an anisotropic conductive film.

* * * * *